United States Patent
Perahia et al.

(10) Patent No.: US 11,509,277 B2
(45) Date of Patent: Nov. 22, 2022

(54) PIEZOELECTRIC SINGLE CRYSTAL SILICON CARBIDE MICROELECTROMECHANICAL RESONATORS

(71) Applicant: HRL Laboratories, LLC, Malibu, CA (US)

(72) Inventors: Raviv Perahia, Malibu, CA (US); Logan D. Sorenson, Malibu, CA (US); Lian X. Huang, Malibu, CA (US); Jeremy Bregman, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 890 days.

(21) Appl. No.: 16/368,802

(22) Filed: Mar. 28, 2019

(65) Prior Publication Data

US 2019/0305749 A1    Oct. 3, 2019

Related U.S. Application Data

(60) Provisional application No. 62/656,713, filed on Apr. 12, 2018, provisional application No. 62/651,052, (Continued)

(51) Int. Cl.
*H03H 3/02* (2006.01)
*H03H 9/205* (2006.01)
(Continued)

(52) U.S. Cl.
CPC .......... *H03H 3/02* (2013.01); *H03H 9/02031* (2013.01); *H03H 9/02228* (2013.01); *H03H 9/0519* (2013.01); *H03H 9/132* (2013.01); *H03H 9/176* (2013.01); *H03H 9/205* (2013.01); *H03H 2003/027* (2013.01); *H03H 2009/155* (2013.01)

(58) Field of Classification Search
CPC .. H03H 3/02; H03H 9/02031; H03H 9/02228; H03H 9/0519; H03H 9/132; H03H 9/176; H03H 9/205; H03H 2003/027; H03H 2009/155
See application file for complete search history.

(56) References Cited

U.S. PATENT DOCUMENTS 6,909,221 B2   6/2005   Ayazi
7,791,432 B2   9/2010   Piazza
(Continued)

OTHER PUBLICATIONS

From U.S. Appl. No. 16/368,737, Office Action dated Jan. 27, 2022.
(Continued)

*Primary Examiner* — Jeffrey M Shin
(74) *Attorney, Agent, or Firm* — Ladas & Parry, LLP (57) ABSTRACT

A resonator has a resonator body and a frame at least partially surrounding the resonator body, the resonator body being coupled to the frame by at least one tether. The resonator body, frame and at least one tether comprise silicon carbide. A plurality of interdigitated electrodes are disposed on the silicon carbide resonator body. The resonator body preferably comprises 6H silicon carbide and preferably has a crystalline c-axis oriented generally parallel to a thickness direction of the resonator body.

24 Claims, 11 Drawing Sheets

Related U.S. Application Data filed on Mar. 30, 2018, provisional application No. 62/651,046, filed on Mar. 30, 2018.

(51) Int. Cl.
*H03H 9/02* (2006.01)
*H03H 9/05* (2006.01)
*H03H 9/13* (2006.01)
*H03H 9/17* (2006.01)
*H03H 9/15* (2006.01)

(56) References Cited

U.S. PATENT DOCUMENTS

| | | | |
|---|---|---|---|
| 8,769,802 | B1 | 7/2014 | Chang |
| 10,281,277 | B1 | 5/2019 | Perahia |
| 10,676,349 | B1 | 6/2020 | Grosjean |
| 2008/0246559 | A1* | 10/2008 | Ayazi ............ H03H 9/172 333/187 |
| 2012/0274184 | A1* | 11/2012 | Stephanou ......... H03H 9/0207 29/25.35 |
| 2017/0040209 | A1 | 2/2017 | Wang |
| 2017/0314160 | A1 | 11/2017 | Ohno |
| 2019/0305744 | A1 | 10/2019 | Perahia |

OTHER PUBLICATIONS

From U.S. Appl. No. 16/368,737, Office Action dated Sep. 22, 2021.
U.S. Appl. No. 16/368,737, Perahia, filed Mar. 28, 2019.

Chandorkar, S. A. et al., "Limits of quality factor in bulk-mode micromechanical resonators," Proc. IEEE Int. Conf. MEMS, 74-77 (2008).

Mehregany, et al. "Silicon carbide MEMS for harsh environments," Proceedings of the IEEE, vol. 86, Issue 8, pp. 1594-1609, Aug. 1998.

Mirgorodsky, et al. "Molecular approach to the modeling of elasticity and piezoelectricity of SiC polytypes," Physical Review B, vol. 52, No. 6, Aug. 1, 1995.

Neudeck, et al., "High-temperature electronics—a role for wide bandgap semiconductors," Proceedings of the IEEE, vol. 90, No. 6, pp. 1065-1076, Jun. 2002.

Perahia, et al.,"Piezoelectric Single Crystal 6H Silicon Carbide Microelectromechanical Resonators," Solid-State Sensors, Actuators and Microsystems Workshop. Hilton Head Island, South Carolina, Jun. 3-7, 2018, pp. 75-78.

Piazza, et al., "Piezoelectric Aluminum Nitride Vibrating Contour-Mode MEMS Resonators," Journal of Microelectromechanical Systems, vol. 15, No. 6, pp. 1406-1418, Dec. 2006.

Svilčić, et al., "Two-Port Piezoelectric Silicon Carbide MEMS Cantilever Resonator," Informacije Midem, Journal of Microelectronics, Electronic Components and Materials, vol. 43, No. 1, pp. 22-26, 2013.

Tabrizian, R. et al.,"Effect of phonon interaction on limiting f.Q product of microelectromechanical resonators," Solid-State Sensors, Actuators and Microsystems Conference, 2009, Transducers 2009, International (4 pages).

Yang, et al., "6H-SiC microdisk torsional resonators in a 'smart-cut' technology," Applied Physics Letters, 104, 091906, 2014.

* cited by examiner

FIG. 7E

PIEZOELECTRIC SINGLE CRYSTAL SILICON CARBIDE MICROELECTROMECHANICAL RESONATORS

CROSS REFERENCE TO RELATED APPLICATIONS

This application is related to and claims the benefit of U.S. Provisional Patent Application Ser. No. 62/651,052 filed on Mar. 30, 2018, U.S. Provisional Patent Application Ser. No. 62/651,046 filed on Mar. 30, 2018, and U.S. Provisional Patent Application Ser. No. 62/656,713 filed on Apr. 12, 2018 which are incorporated herein by reference. This application is related to U.S. application Ser. No. 16/368,737 filed concurrently herewith and entitled "Method of Fabricating a SiC Resonator", the disclosure of which is hereby incorporated herein by reference.

TECHNICAL FIELD

The present writing is directed in general to the field of resonators, and in particular, to silicon carbide (SiC) resonators and methods of fabricating the same. The technology presented herein and obvious from that which is presented, is applicable to programs and systems that utilize SiC in resonators. However, the resonators and methods presented herein will be applicable to other resonators as those skilled in the art will appreciate.

BACKGROUND OF THE TECHNOLOGY

SiC microelectromechanical (MEMS) resonators are important components in new phononic gyroscope technology (see, for example, U.S. patent application Ser. No. 15/347,748, entitled "Phononic Travelling Wave Gyroscope," filed Nov. 9, 2016) as well as in future radio frequency (RF) technology, among other technologies.

Gyroscope Technology:

There are currently both short-term and long-term needs for small MEMS gyroscopes which utilize MEMs resonators. Tactical and navigation grade gyroscopes are in great demand by both private and government entities. In many applications, a gyroscope can be used to mitigate the number of temporal lapses occurring in onboard navigation systems, whether these lapses are due to Global Positioning System (GPS) denial or due to the degradation of other navigation sensors due to environmental or operational effects.

There is also a need for low-cost, tactical-grade MEMS gyroscopes. Yaw sensors are already part of vehicle stabilization systems, and software compasses are implemented in high-end vehicle models. A MEMS gyroscope can compensate for the lapses in a GPS signal due to environmental effects and obstructions, enabling navigation capabilities within tunnels, underground structures, multi-tiered parking lots, and urban environments where GPS signals are obstructed.

The government continues to have a need for small and accurate gyroscopes. Applications vary from unmanned aerial vehicle (UAV) navigation systems to underground military applications, including targeting and munitions engineering. The interest of the government is shown by the abundance of current and past programs. Unfortunately, programs have yet to succeed in attaining a navigation-grade performance of a MEMS gyroscope in operationally relevant environments. The inventors think achieving this goal may be possible by utilizing the technology herein presented.

Rf Technology:

The technology herein presented applies to high-performance RF MEMS technology, including the phononic manipulation of ultra-high frequency (UHF) waves, which impacts the accuracy, power handling, channel density, and interference of communication, radar, and wireless systems. There is a significant interest in radar, timing, frequency control, and communications applications for this technology. Software-programmable radios and communications systems are possible applications for the MEMS phononics technology herein presented. The wafer scaling nature of this technology provides a smooth transition path to a high-volume, low-cost production of resonators.

Patents and Academic Literature of Interest:

U.S. Pat. No. 6,909,221 entitled "Piezoelectric on Semiconductor-on-Insulator Microelectromechanical Resonators" (Ayazi et al.) describes an embodiment of a piezoelectric resonator wherein a piezoelectric layer is deposited on a semiconductor substrate layer. In the technology herein presented, a piezoelectric layer, which is preferably single crystalline 4H- or 6H-SiC, is temporarily bonded to a semiconductor handle wafer which is later removed to form the resonator from 4H- or 6H-SiC. Single-crystalline 4H- or 6H-SiC is an acoustically low-loss material and results in higher frequency-quality factor products needed for high-stability oscillators compared with the nominal piezoelectric-on-semiconductor material layer stacks.

U.S. Pat. No. 7,791,432 entitled "Contour-Mode Piezoelectric Micromechanical Resonators" (Piazza et al.) describe embodiments of a resonator wherein AiN rather than SiC (as disclosed herein) is utilized as the piezoelectric material between top and bottom electrodes. Additionally an embodiment of a resonator is described with two piezoelectric layers being disposed between an interleaved electrode and a bottom electrode. In the technology herein presented, the resonator preferably comprises a single piezoelectric layer of SiC between an interleaved top electrode and a bottom electrode.

Relevant academic literature which is incorporated by reference herein includes the following:

[1] Mehregany, et al. "Silicon carbide MEMS for harsh environments," Proc. of the IEEE, Volume 86, Issue 8, pp. 1594-1609, August 1998;

[2] Sviličić, et al. "Two-Port Piezoelectric Silicon Carbide MEMS Cantilever Resonator," Informacije Midem, Journal of Microelectronics, Electronic Components and Materials, Volume 43, No. 1, pp. 22-26, 2013;

[3] Piazza, et al. "Piezoelectric Aluminum Nitride Vibrating Contour-Mode MEMS Resonators," Journal of Microelectromechanical Systems, Vol. 15, No. 6, pp. 1406-1418, December 2006;

[4] Yang, et al. "6H-SiC microdisk torsional resonators in a 'smart-cut' technology,' Applied Physics Letters, 104, 091906, 2014;

[5] Neudeck, et al. "High-temperature electronics—a role for wide bandgap semiconductors," Proc. of the IEEE, Vol. 90, No. 6, pp. 1065-1076, June 2002;

[6] Mirgorodsky, et al. "Molecular approach to the modeling of elasticity and piezoelectricity of SiC polytypes," Phys. Rev. B, Volume 52, Number 6, Aug. 1, 1995.

SUMMARY

A single-crystalline silicon carbide (SiC) microelectromechanical (MEMS) resonator that does not necessarily use additional material to accomplish a piezoelectric effect is herein presented. The resonator is made with 6H-SiC (or alternatively, 4H-SiC) using fabrication methods presented in U.S. Provisional Patent Application Ser. No. 62/651,052 filed on Mar. 30, 2018 and its related non-provisional application filed contemporaneously herewith entitled "Method of Fabricating a SiC Resonator" (Attorney Docket No. 631435-0) the disclosure of which is incorporated herein by reference. 6H- and 4H-SiC are naturally piezoelectric and low-loss acoustic materials, making them ideal for higher-frequency (10 MHz thru 10 GHz) applications and high-quality factor oscillators and resonators. Additional, "lossy" piezoelectric materials are preferably selectively removed from the SiC material of the resonator, which lossy materials, if otherwise not selectively removed, would reduce the quality factor of the resonator. "Lossy material" is defined as a material that dissipates electromagnetic or acoustic energy passing through it.

In addition, the large bandgap of SiC (3.23 V for 4H-SiC and 3.05 V for 6H-SiC) enables a high-voltage (>30 $V_{ac}$) operation, which enables a reference oscillator to generate frequency sources at ultra-high frequencies (e.g. 300 MHz to 3 GHz), which can be useful for radio transmitter applications.

BRIEF DESCRIPTION OF THE DRAWINGS

For a more complete understanding of the present technology and its features, reference is now made to the following description taken in conjunction with the accompanying drawings, in which like reference numerals represent like parts.

DETAILED DESCRIPTION

Although example embodiments are illustrated below, the present technology may be implemented using any number of techniques, whether currently known or not. The present technology should in no way be limited to the example implementations, drawings, and techniques illustrated below. Additionally, the drawings are not necessarily drawn to scale.

In the following description, certain terminology is used for the purpose of reference only, and is not intended to be limiting. For example, although the terms first, second, etc. may be used herein to describe various elements, these elements should not be limited by these terms. These terms are only used to distinguish one element from another. As used in the description of the technology and the appended claims, the singular forms "a," "an," and "the" are intended to include the plural forms as well, unless the context clearly indicates otherwise. It will also be understood that the language "and/or" as used herein refers to and encompasses any and all possible combinations of one or more of the associated listed terms. It will be further understood that the terms "comprises" and/or "comprising," when used in this specification, specify the presence of stated features, integers, steps, operations, elements, and/or components, but do not preclude the presence or addition of one or more other features, integers, steps operations, elements, components, and/or groups thereof.

The technology herein presented has several applications. For example, as a standalone resonator, the resonator herein presented has a quality factor higher than that of traditional quartz devices, by a factor of at least 10 (the frequency-quality factor products for SiC and quartz are 3×10¹¹ and 3×10¹³, respectively). The resonator can generate oscillation signals at ultra-high frequencies (300 to 3,000 MHz), which quartz devices are unable to do. The resonator can operate at higher temperatures than quartz devices, since SiC does not "twin" like quartz does at high temperatures (e.g. 600-700° C.); this twinning in quartz prevents quartz from resonating at higher temperatures (e.g. 500° C.) because quartz loses its piezoelectric properties at moderate temperatures. Here, the terms "twin" and "twinning" refer to crystal twinning, which occurs when two or more crystals share some of the same crystal lattice points. In the context of the present disclosure, the 2-dimensional boundary between adjacent, twinned regions of a crystal are viewed as mechanical defects that affect the propagation of phonons in the material and hence the properties of resonator. The resonator can act as a drive and sense mechanism for phononic waveguide devices. The resonator can become a basis for environmentally robust sensing technologies (e.g., high-temperature, frequency-modulated sensors, wherein the frequency changes in response to a desired external stimulus). The preceding applications are intended to be considered as exemplary only, and are not to limit the scope of the present technology here presented.

In the past, there have been barriers to making a high-quality MEMS resonator out of single-crystalline SiC. U.S. Provisional Patent Application Ser. No. 62/651,052 filed on Mar. 30, 2018 describes methods for making the disclosed MEMS resonator out of single-crystalline 4H- and 6H-SiC. The processes described herein and in the accompanying disclosure are fundamentally different from the "smart-cut" process described in Ref [4] above, allowing the addition of metals to top and bottom surfaces of a piezoelectric SiC layer to form the resonator with driving and sensing electrodes. Further, etching techniques have been developed to address the difficulty involved with etching through the piezoelectric SiC layer when the SiC layer is thick (for example, >100 nm). In short, barriers which have prevented others from making the MEMS resonator presented herein have been overcome.

By utilizing single-crystal 4H- or 6H-SiC as the piezoelectric and mechanical material in the resonator, the resonator presented herein can operate at higher frequencies and higher quality factors than previous MEMS resonators made of lower quality piezoelectric materials (such as aluminum nitride (AlN), zinc oxide (ZnO), and lead zirconate titanate (PZT)). 4H- and 6H-SiC have the potential to displace high quality resonator materials such as quartz and lithium niobate. Further, due to the high bandgap (≥3.0 eV for the hexagonal polytypes) of SiC, the herein presented resonator can operate at higher voltage levels, enabling a high voltage (>10 $V_{ac}$) oscillation output at a sensing electrode. Indeed, operation at 30 $V_{ac}$ has been achieved.

Figure 1:
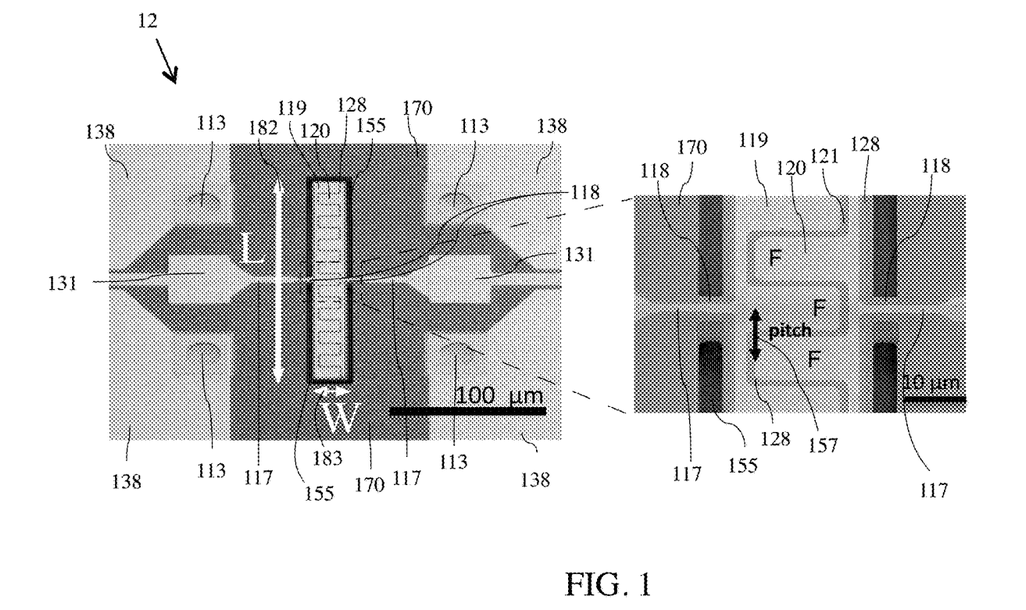
FIG. 1 illustrates a scanning electron microscope image of a top view of a resonator, according to an embodiment of the technology herein presented. On the right-hand side of this figure is an enlarged view of a portion of the resonator shown on the left-hand side thereof.

FIG. 1 illustrates a scanning electron microscope (SEM) image of a top view of a single crystalline SiC resonator 12 according to an embodiment of the present disclosure. with an enlarged view of a portion of the resonator 12 on the right-hand side of FIG. 1. The resonator 12 can comprise a combination of elements depicted in FIG. 1 which are described in more detail in the following description.

In the embodiment shown in FIG. 1 the resonator 12 includes a resonator plate 128 which is preferably made or etched from a single layer 170 of 6H-SiC. However, in other embodiments, the resonator plate can be made from other polytypes of SiC. For example, the resonator plate 128 can be made from a single layer 170 of 4H- or 3C-SiC.

The resonator plate 128 has a length L and a width W, as indicated by arrows 182 and 183, respectively, in the SEM image of FIG. 1. The darkened "U" shaped gaps 155 (see also gap 155 on FIG. 1B) are etched regions where SiC is removed from the SiC layer 170, for example, by etching, to form a substantially freestanding resonator plate 128 of length L connected to the remaining SiC layer 170 by narrow tethers 118. The SiC layer 170, tethers 118, and resonator plate 128 are unetched portions of a bare SiC layer (not shown) from which layer 170, tethers 118, and resonator plate 128 are etched.

Visible on top of the SiC layer 170 and tethers 118 are patterned metal traces 117 which may comprise Cr/Au, for example, and which are utilized to electrically connect signal pads 131 (on the left and right sides of the resonator of FIG. 1) to interdigitated driving and sensing electrodes 119 and 120 formed on the top surface of the resonator plate 128. Each interdigitated electrode 119 and 120 has a plurality of fingers or protrusions which are spaced from each other by a serpentine path or gap 121 which exposes the resonator plate 128 below. Three of the fingers or protrusions are individually identified by the letter "F" on FIG. 1. The total number of individual fingers or protrusions "F" associated with each electrode 119, 120 may be varied as needed. The signal pads 131 can be used to couple a RF signal to the interdigitated electrodes 119 and 120.

Figure 1A:
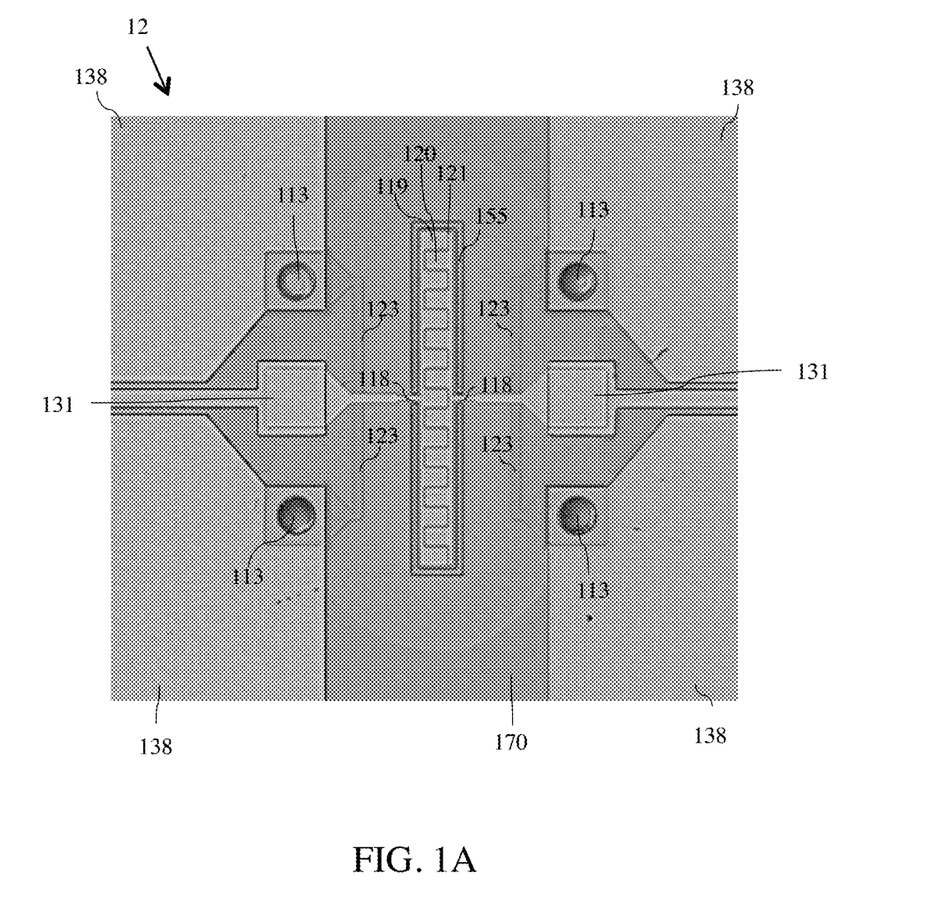
FIG. 1A illustrates an enlarged optical image of the top view of the resonator shown in FIG. 1, according to an embodiment of the technology herein presented.
Figure 1B:
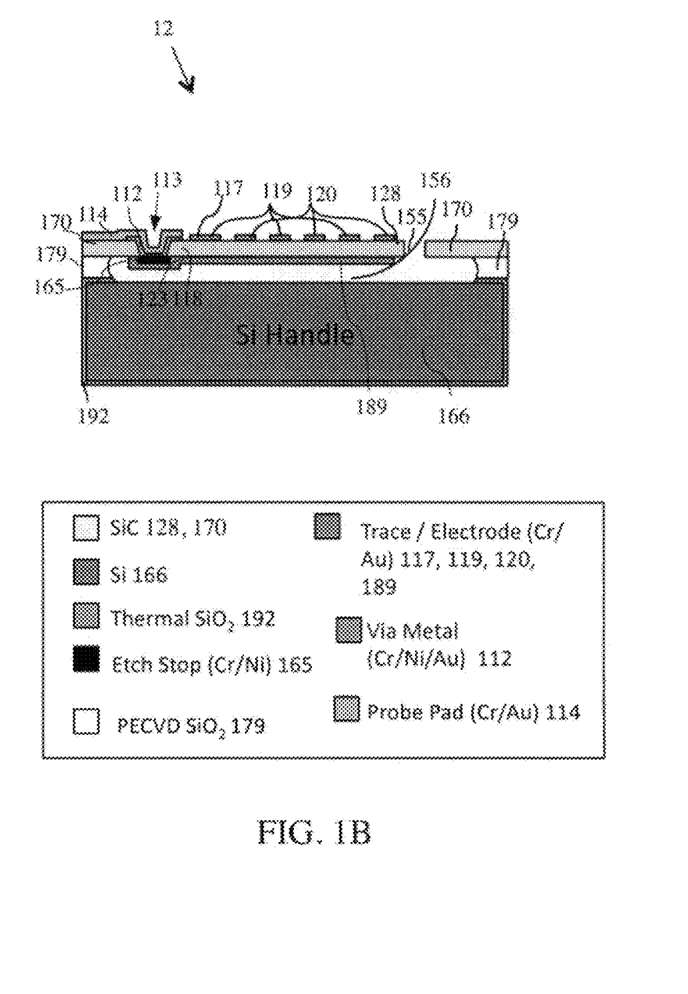
FIG. 1B illustrates a cross-sectional view of the enlarged portion of the resonator shown in FIG. 1, according to an embodiment of the technology herein presented.

Also depicted on the left hand side of FIG. 1 are four circular metallized vias 113 near the corners of the SEM image of FIG. 1 which vias 113 may be used to electrically connect ground pads 138 also formed on the top surface of the SiC layer 170 to traces 123 (see FIG. 1A) formed on the bottom surface of the SiC layer 170 and tethers 118 (seen in FIG. 1B). The traces 123 may be formed of the same material(s) as traces 117.

An enlarged view of a portion of the resonator 12, including the tethers 118, is illustrated on the right-hand side of FIG. 1. The distance indicated by arrow 157 in FIG. 1 represents the pitch of the fingers "F" of electrodes 119 and 120. The resonant frequency of the resonator 12 can be given by $$f = \frac{N}{2L} v_{acoustic}, \qquad \text{(Eqn. 1)}$$

where L is the length of the resonator plate 128, N is the number of fingers "F" associated with electrode 119 plus the number of fingers "F" associated with electrode 120, and $v_{acoustic}$ is the speed of sound in the resonator plate 128. The resonator 12 preferably has a number of fingers or protrusions "F" associated with electrodes 119 and 120 in the range 1≤N≤50. The width W of the resonator plate 128 may be in the range between 5 micrometers and 1 millimeter (inclusive), depending on a desired design. The length L of resonator plate 128 is preferably also in the range between 5 micrometers and 1 millimeter (inclusive) and can be determined by N, the pitch of electrodes 119 and 120, and/or the desired resonant frequency of the resonator 12 as described by Eqn. 1 above.

FIG. 1A illustrates an optical image of the top view of the SiC resonator 12 shown in FIG. 1, wherein traces 123 formed (i) on the bottom surface of the SiC layer 170 can be seen through the SiC layer 170 and (ii) and on the bottoms of tethers 118 (hidden in FIG. 1A). These traces 123 electrically connect the metallized vias 113 to the bottom electrode 189 (see also FIG. 1B) of the resonator 12. FIG. 1B illustrates a schematic cross-sectional view of the single crystalline SiC resonator 12 shown in FIGS. 1 and 1A with some of the cross section omitted for ease of illustration as is explained in U.S. application Ser. No. 16/368,737 filed concurrently herewith. The unetched portions of the SiC layer are the SiC layer 170 and the resonator plate 128 and its tethers. A silicon (Si) handle layer 166 depicted in FIG. 1B may be utilized as a supporting substrate for the SiC layer 170, the tethers 118, and the resonator plate 128 while the resonator is being made. The SiC layer 170 and the Si handle layer 166 may be separated by an oxide (e.g. silicon dioxide or $SiO_2$) layer 179. During fabrication, the Si handle layer 166 is preferably lightly oxidized on its surface so that a $SiO_2$ layer 192 is formed on the surface of the Si handle layer 166 to facilitate bonding (preferably void free) between the layers 179 and 192.

The SiC layer has U-shaped gaps 155 etched through it to define the resonator plate 128, the SiC layer 170, and the tethers 118. The gaps 155 are discontinuities between the SiC layer 170 and the resonator plate 128, as shown in FIGS. 1, 1A and 1B. A second gap 156 spaces the resonator plate 128 from the Si handle layer 166, and the resonator plate 128 is suspended above the second gap 156 by the tethers 118 which are connected to the SiC layer 170 supported above the Si handle layer or wafer 166.

The metallized vias 113 are preferably formed by etching, preferably entirely through the SiC layer 170. The traces 117 and 123 are formed on the top and bottom surfaces, respectively, of the SiC layer 170 and the tethers 118. Driving and sensing electrodes 119 and 120 preferably comprise gold (Au) and are formed on the top surface of the resonator plate 128. The traces 117 formed on the top surface of SiC layer 170 and tethers 118 are connected to the driving and sensing electrodes 119 and 120 are also preferably formed on the top surface of the resonator plate 128; the traces 123 formed on the bottom surfaces of SiC layer 170 and tethers 118 are connected to bottom electrode 189 formed on the bottom surface of the resonator plate 128. In a preferred embodiment, the electrodes 119 and 120 are interdigitated electrodes patterned on the resonator plate 128 (as seen, for example, on FIG. 1).

Region 165 is an etch stop which prevents over etching of the via 113 during the fabrication of the resonator 12. A conformal region 112 made of the via metal (e.g. Cr/Ni/Au, deposited in that order) preferably lines the walls of the metallized via 113 in the SiC layer 170. An additional probe pad 114 maybe added on top of the via metal 112 to ensure continuity and/or electrical conductivity of an electrical signal propagating through the metallized vias 113. The probe pad 114 can be used for wire bonding an electrical connection to the bottom electrode 189, or for probing the bottom electrode 189. Probe pad 114 is optional and only shown in FIG. 1B.

Figure 2:
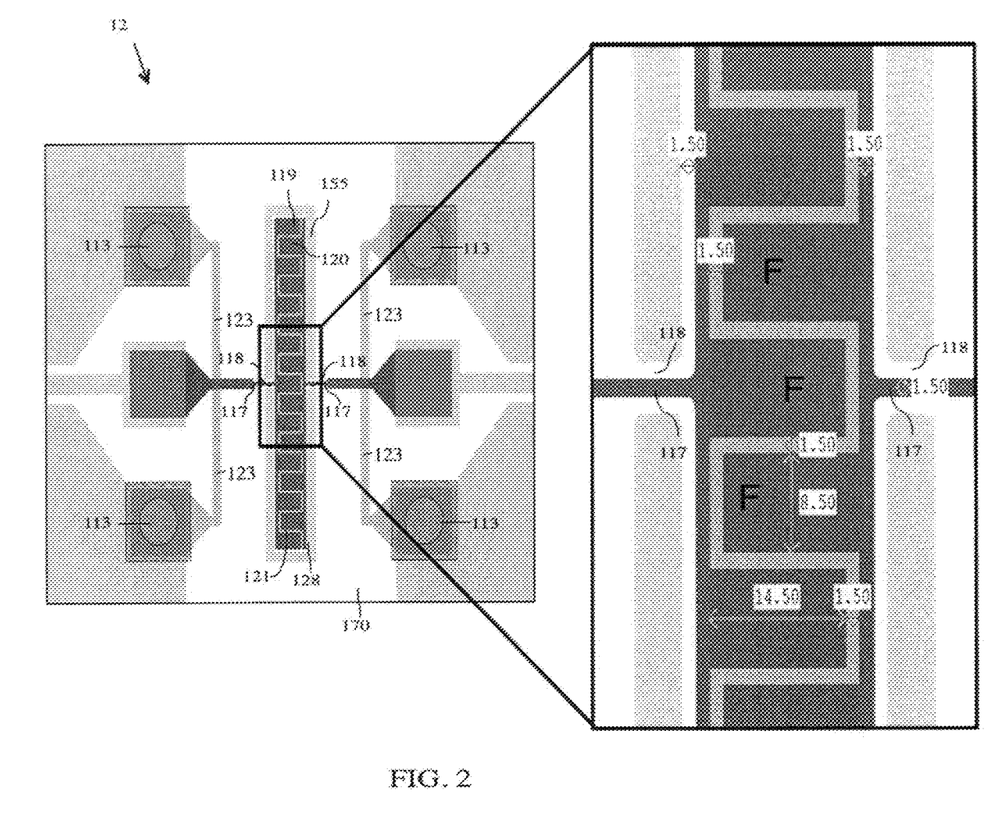
FIG. 2 illustrates a top view of a resonator, according to an embodiment of the technology herein presented with an enlarged view of a portion of the resonator illustrated on the right-hand side thereof.

FIG. 2 illustrates a further top view of an embodiment of SiC resonator 12 as depicted through the use of photolithography mask layout software, as opposed to a scanning electron microscope image, such as that depicted by FIGS. 1 and 1A. The right-hand side of FIG. 2 is an enlarged view of a portion of the resonator 12 illustrated on the left-hand side of FIG. 2. For the purposes of brevity, previous descriptions of resonator 12 can be incorporated into FIG. 2 and, insofar as the same is applicable, the same description need not be repeated.

The number of fingers (or protrusions) "F" interdigitated (or interleaved) between electrodes 119 and 120 are not necessarily consistent between the various figures, it being understood that the numbers of fingers (or protrusions) interdigitated (or interleaved) between electrodes 119 and 120 may vary depending, for example, on the intended frequency of operation of the resonator.

In FIG. 2 exemplary dimensions are provided. However, other embodiments may utilize dimensions different than those shown in FIG. 2. The units of the labeled dimensions are micrometers (or microns). For example, in the embodiment of FIG. 2, the gap 155 is 1.5 micrometers in width, the width of the tethers 118 is 1.5 micrometers, the width of each finger "F" of the electrodes 119 and 120 is 8.5 micrometers, and the width W of the resonator plate 128 is 19 micrometers. The number of fingers "F" of electrodes 119/120 in the embodiment of FIG. 2 is N=17 and the length L of the resonator plate 128 is 168.5 micrometers. However, N and L can be changed to produce a different resonant frequency in accordance with Eqn. 1. The pitch of the fingers F is 10 micrometers and the pitch may be varied as well as described with reference to FIG. 5. The dimensions shown in FIG. 2 are merely exemplary and those skilled in the art will understand that these dimensions can be varied as needed or convenient.

Figure 3:
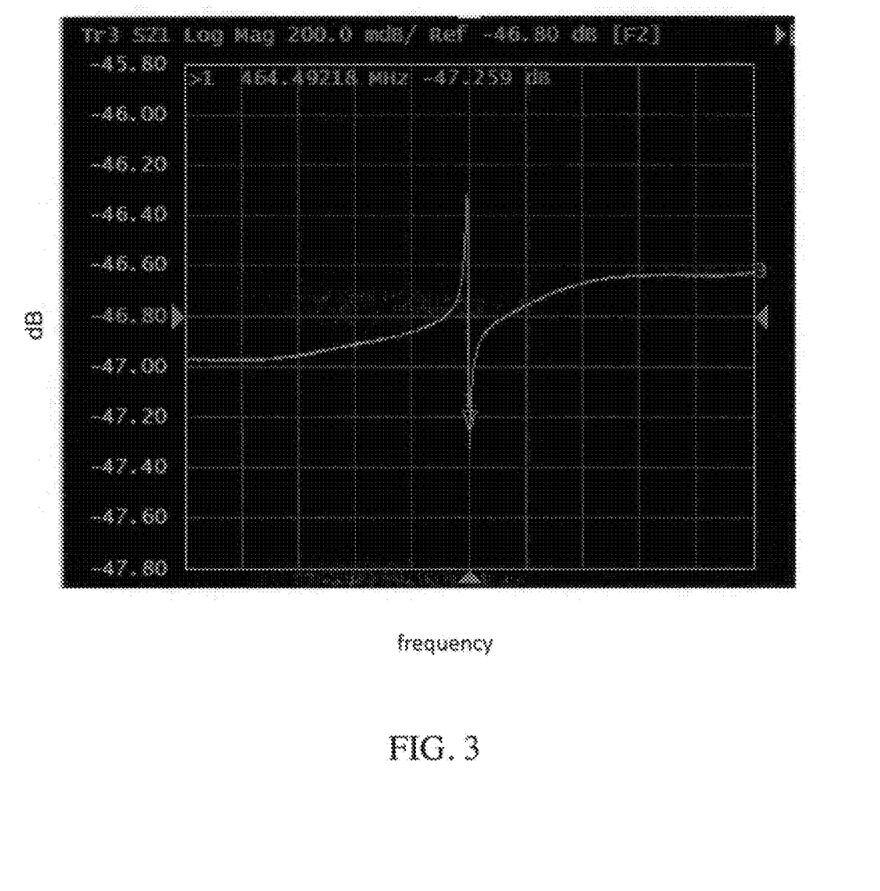
FIG. 3 graphically illustrates the transmission $S_{21}$ of a resonator as a function of frequency, according to an embodiment of the technology herein presented.
Figure 4:
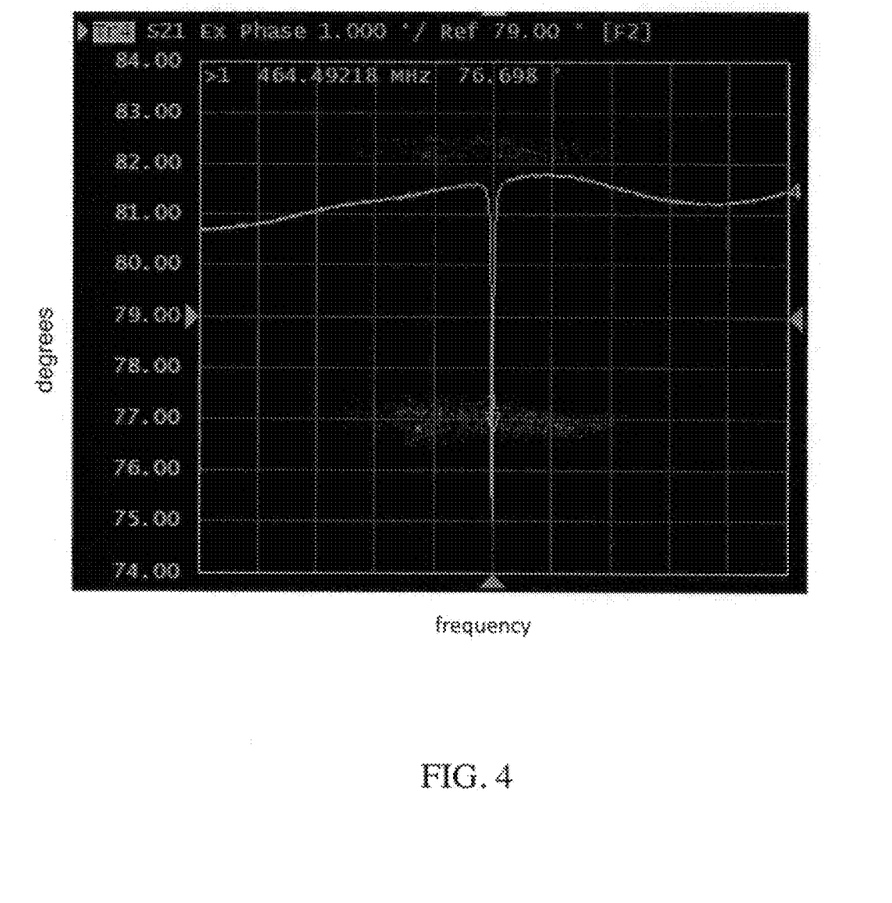
FIG. 4 graphically illustrates the phase of the transmission $S_{21}$ of a resonator as a function of frequency, according to an embodiment of the technology herein presented.

FIGS. 3 and 4 graphically illustrate the transmission $S_{21}$ ("S" is a forward voltage gain in an S-parameter matrix for a 2-port network) illustrates the amplitude and phase of the transmission $S_{21}$ of a resonator as a function of frequency when it is built with the dimensions shown in FIG. 2. In FIGS. 3 and 4, the x-axis is frequency, a 20 MHz span centered about 464 MHz. In FIG. 3, the y-axis is in dB; for FIG. 4, the y-axis is in degrees. An Agilent E5061B vector network analyzer was used to measure the transmission $S_{21}$ of the resonator which was produced via a piezoelectric response. The transmission $S_{21}$ was measured by applying a RF signal to electrode 119, thereby inducing strain regions on the resonator plate 128 via the piezoelectric effect, and measuring a voltage on the resonator plate 128 resulting from the induced strain regions and the piezoelectric effect using electrode 120. The voltage measured using electrode 120 is the piezoelectric response of the resonator, and this voltage was used to measure the transmission $S_{21}$ and the phase of the transmission $S_{21}$ as graphically illustrated in FIGS. 3 and 4, respectively. The resonant frequency of this particular resonator is 464.5 MHz, and the frequency spans 20 MHz, indicated by the sharp peak in the transmission $S_{21}$ at that frequency in FIG. 3 and the corresponding dip in the phase of the transmission in FIG. 4. Looking at FIG. 3, the dip in the transmission $S_{21}$ demonstrates the characteristic anti-resonance indicative of capacitive feedthrough (i.e. capacitive coupling between the top electrodes 119/120 and the bottom electrode 189) in the piezoelectric resonator.

Figure 5:
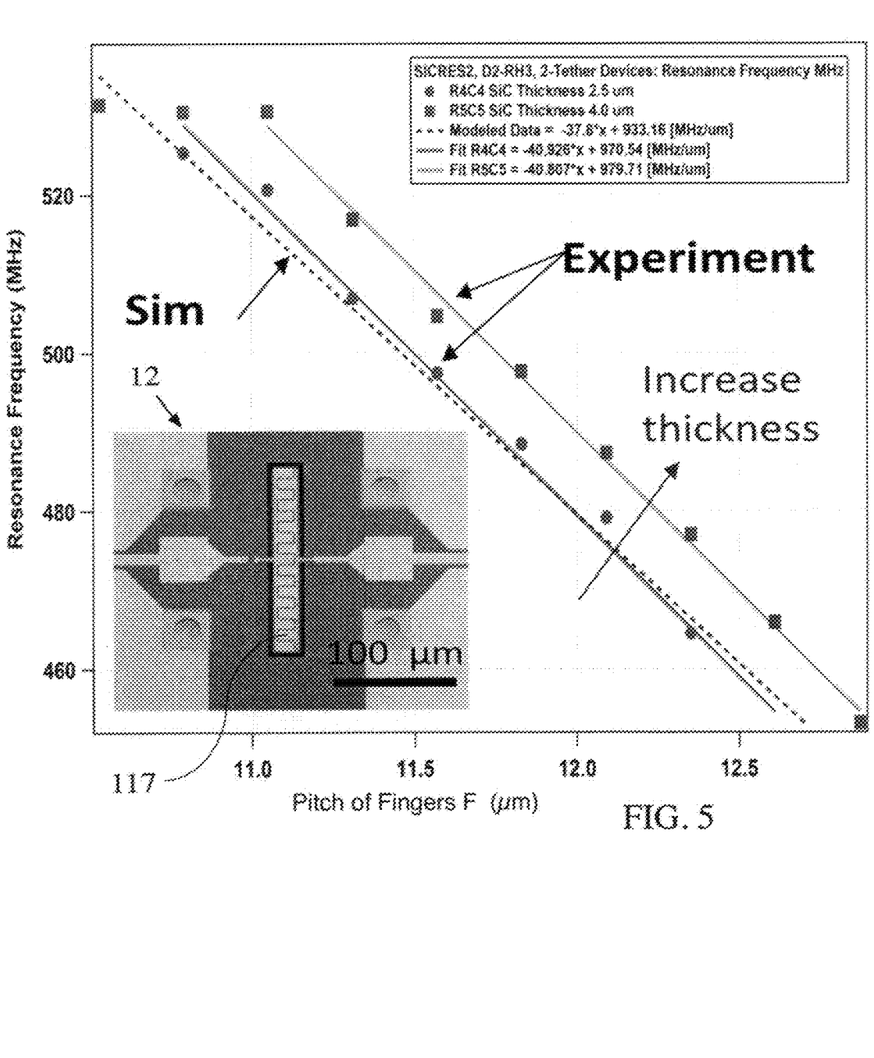
FIG. 5 graphically illustrates resonant frequency measurements of multiple resonators as a function of electrode pitch, according to embodiments of the technology herein presented.

FIG. 5 graphically illustrates resonant frequency simulations and resonant frequency measurements of multiple embodiments of resonator 12 as a function of interdigitated electrode pitch, according to embodiments of the technology herein presented. The resonator plates 128 of the multiple SiC resonators 12 have two different thicknesses, 2.5 μm and 4.0 μm, of SiC, wherein each resonator 12 has seventeen electrode fingers "F". Each point square data point on the graph of FIG. 5 represents one embodiment of resonator 12 and each circular data point represents a slightly different embodiment of resonator 12. The two embodiments represented by the square and circular data points differed by different pitches between the fingers F and two different SiC thickness of the resonator plate 128. The circular data points correspond to resonators 12 with a SiC thickness of 2.5 μm, and the square data points correspond to resonators 12 with a SiC thickness of 4.0 As expected from Eqn. 1, an increase in the pitch of the electrodes 119 and 120 in resonator 12 results in a decrease in the resonant frequency of the resonator 12. The data illustrated in FIG. 5 is a strong indicator that the different embodiments of SiC resonators 12 appear to behave as expected from theory. In FIG. 5, the resonator 12 with a thickness of 2.5 μm had the smallest measured resonant frequency when the electrode pitch was 12.35 μm. The dashed line shown in FIG. 5 was produced using a finite element analysis using the software COMSOL. The finite element analysis uses a resonator thickness of 2.7 μm (reflecting the fabricated resonator) to simulate its resonant frequency.

Figure 6:
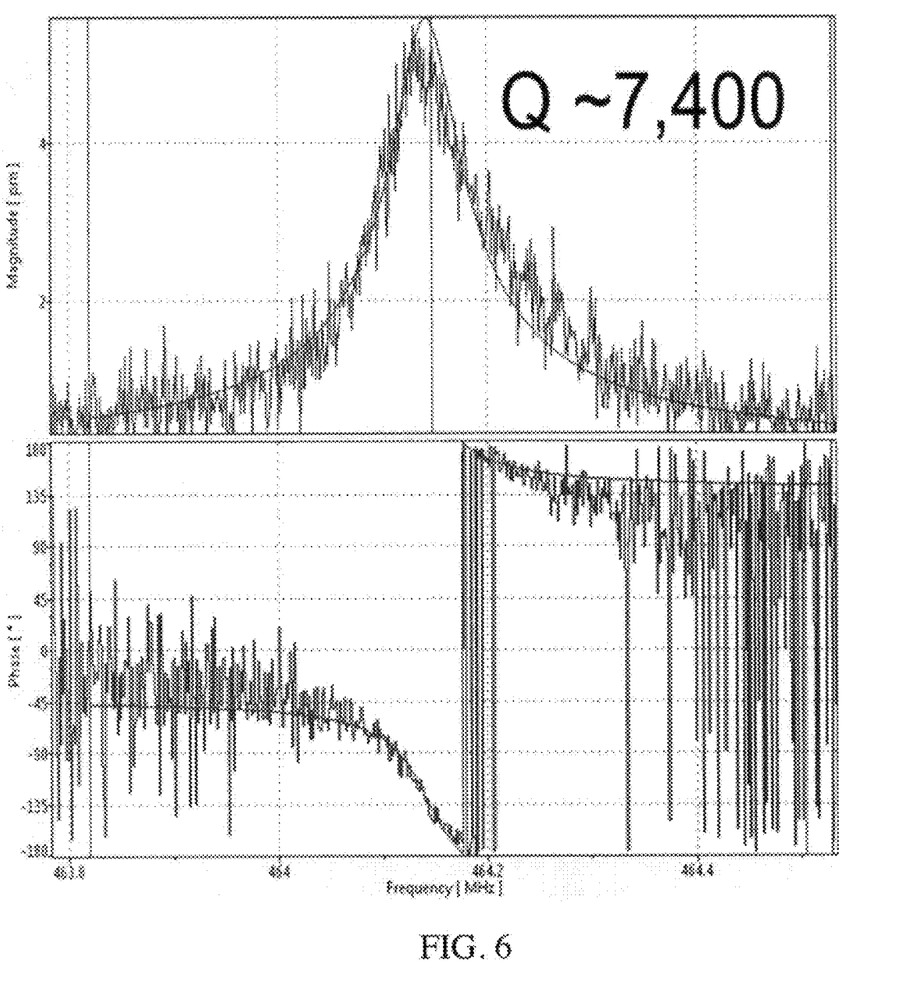
FIG. 6 graphically illustrates measured vibration properties of a resonator as a function of frequency, according to an embodiment of the technology herein presented.

FIG. 6 graphically illustrates measured vibration properties of a resonator 12 as a function of frequency, according to an embodiment of the technology herein presented when it is built with the dimensions shown in FIG. 2. A vibrometer measurement was performed by applying an electrical signal to the drive electrodes 119 and 120, and sensing the piezoelectric response of the resonator 12 using a laser Doppler vibrometer. The magnitude shown in the upper graph of FIG. 6 is the magnitude of the z-displacement of the resonator plate 128 as a function of the frequency of the electrical signal. The phase difference graphically illustrated in the lower graph of FIG. 6 is the phase difference between the laser beam incident on the resonator plate 128 and the laser beam reflected from the resonator plate 128. Resonance is indicated by the peak in the z-displacement of the resonator as a function of frequency. Resonance is also indicated by the change in sign of the phase difference as a function of frequency. The quality factor (Q) is measured by fitting a Lorentzian function to the peak of the z-displacement of the resonator. The upper graph of FIG. 6 graphically illustrates the fitted Lorentzian function alongside the magnitude of the z-displacement of the resonator as a function of frequency. Here, the quality factor is the frequency divided by the full width at half maximum of the fitted Lorentzian function. In the upper graph of FIG. 6, the quality factor (Q) is 7400 and the resonant frequency is 464.2 MHz, resulting in a frequency-quality factor product of $3.4 \times 10^{12}$. This is a frequency-quality factor product approaching that of crystalline quartz ($3 \times 10^{13}$). With further improvements to the resonator (for example, by reducing anchor loss from the tethers 118), a frequency-quality factor product of $3 \times 10^{14}$ and potentially $6 \times 10^{14}$ can be achieved, surpassing that of quartz, making the herein presented resonator a high performing resonator in terms of phase noise and oscillator stability. These qualities make the herein presented resonator ideal for high-frequency and high-power oscillators. Here, the term "anchor loss" can refer to the mechanical energy transferred from, for example, resonator plate 128, through tethers 118, and to layer 170.

Figure 7A:
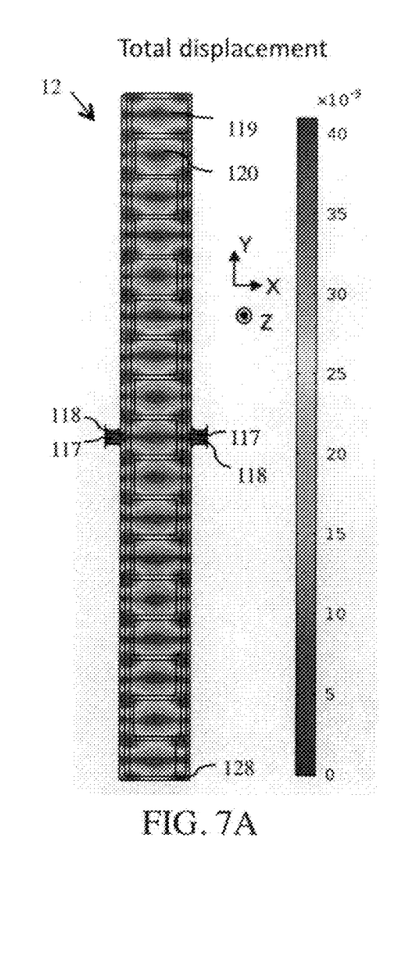
FIGS. 7A-7C graphically illustrate simulated displacements of a resonator operating at resonance, according to an embodiment of the technology herein presented.
Figure 7B:
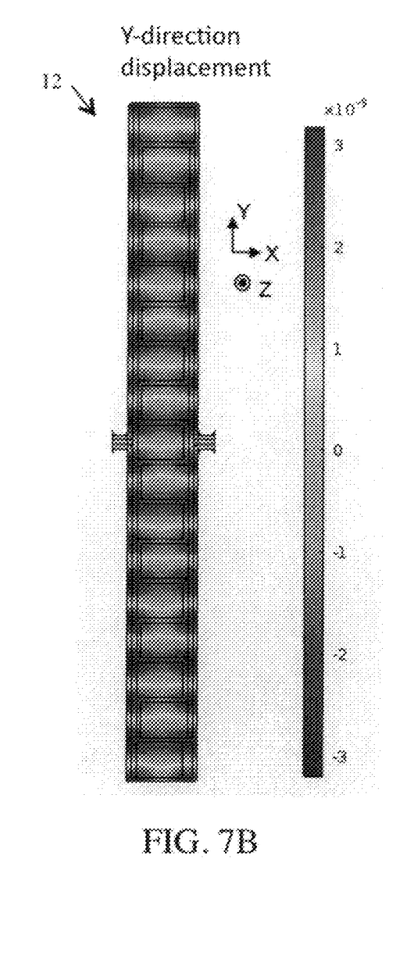
Figure 7C:
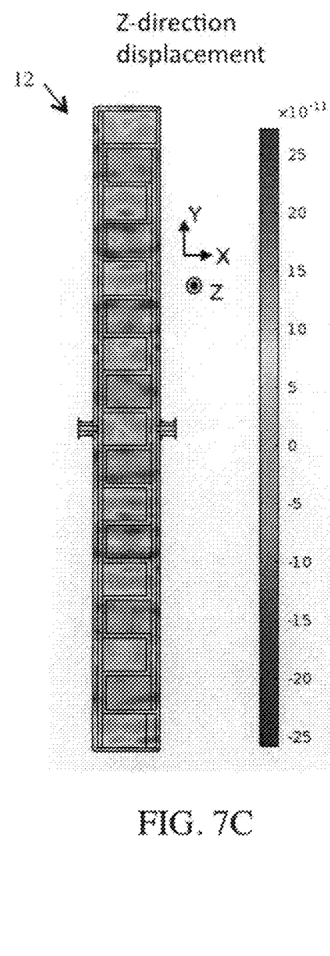
Figure 7D:
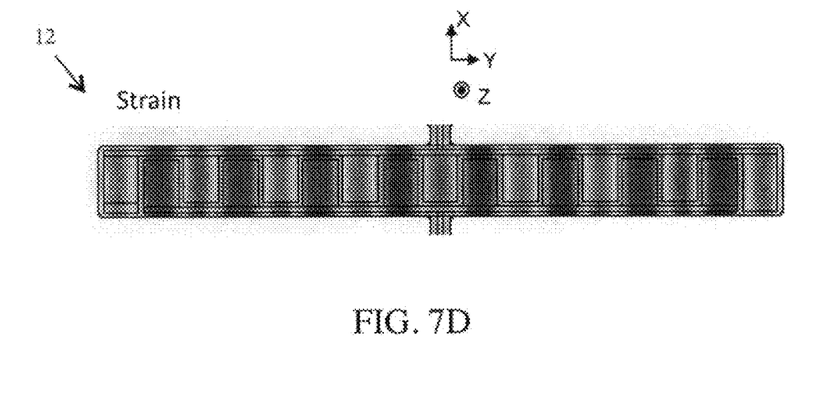
FIG. 7D graphically illustrates a simulated strain of a resonator operating at resonance, according to an embodiment of the technology herein presented.
Figure 7E:
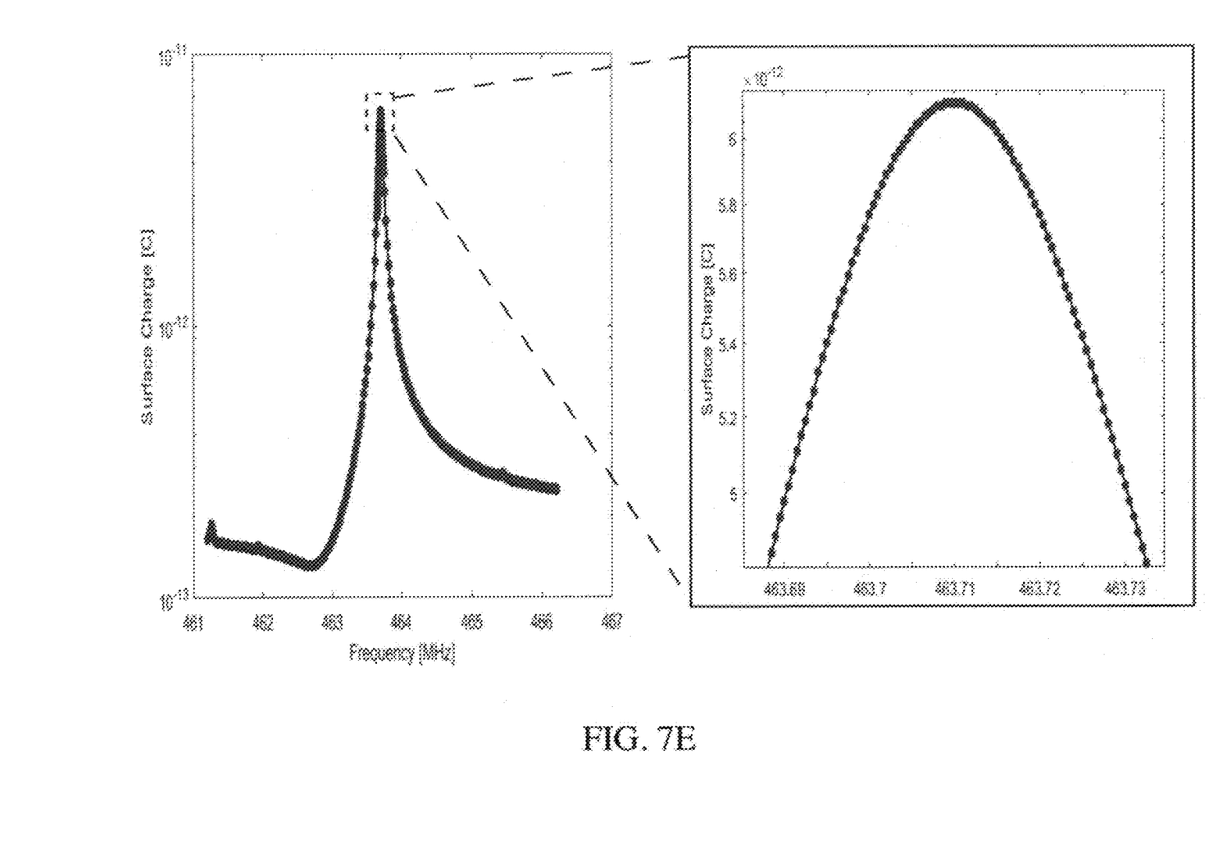
FIG. 7E graphically illustrates a simulated piezoelectric response of a resonator, according to an embodiment of the technology herein presented, and on the right-hand side of this figure, is an enlarged view of a portion of the response graph on the left-hand side, according to an embodiment of the technology herein presented.

A finite element method (FEM) simulation of the expected mode profile of a resonator 12 when it is built with the dimensions shown in FIG. 2 is shown in FIGS. 7A-7E, the right-hand side of FIG. 7E illustrating an enlarged view of a portion of the depiction of the left-hand side of FIG. 7E. In FIG. 7E, the units of charge are Coulombs. The 6H-SiC in resonator plate 128 (see FIG. 7A) has its crystalline c-axis oriented generally parallel to the thickness direction (or z-direction) of the resonator plate 128; therefore, a high-order, in-plane, extensional mode can be excited via the lateral field piezoelectric coefficient $e_{31}$ by applying voltages to the electrodes 119 and 120 to form an electric field that alternates in polarity along the y-direction of the resonator plate 128. The high-order, in-plane extensional mode is the mode in which the displacement of the resonator 12 is in the y-direction. FIG. 7A shows the total displacement field (in meters), while FIGS. 7B and 7C show the displacements (in meters) along the y-direction and z-direction, respectively, wherein the majority of displacements and vibrations occur along the y-direction of the resonator 12.

In FIG. 7D, it is seen that the alternating electric field polarity induces an extensional strain region generally centered at each finger of the electrodes 119 and 120, wherein maximum displacement regions on the resonator plate 128 are maximum strain regions. The extensional strain regions alternate in polarity along the length (or y-direction) of the resonator plate 128. Details of the strain of SiC in terms of an applied electric field can be found in Ref. [6].

FIG. 7E graphically illustrates a coupled piezoelectric frequency domain analysis of the resonator 12 when a RF drive voltage is applied to electrode 119 and a piezoelectrically-generated charge is collected on electrode 120. FIG. 7E graphically illustrates the charge of the electrode 120 as a function of the frequency of the RF drive voltage. For resonator 12, a simulated resonant frequency of 463.7 MHz is calculated, which is consistent with the experimental results from electrical and optical testing, 464.5 (see FIGS. 3 and 4) and 464.2 MHz (see FIG. 6), respectively.

The resonator disclosed herein can be fabricated in a process similar to a silicon-on-insulator (SOI) process. As shown in FIG. 1B, the 6H-SiC layer can be bonded to a Si substrate 166 with an intermediate sacrificial $SiO_2$ dielectric layer 179 to form a silicon carbide-on-insulator (SiCOI) wafer. During operation, a RF electric field can be applied in the thickness direction (z-direction) by a set of electrodes 119 and/or 120 formed on top of the SiC resonator plate 128, wherein the electric field has an alternating polarity along the length of resonator plate 128. A ground electrode 189 is preferably formed on the bottom of the SiC resonator plate 128, the ground electrode being accessed with metallized vias 113. The sacrificial oxide layer 179 is at least partially removed using either hydrofluoric acid (HF) vapor etching or liquid HF etching followed by a critical point drying of the resonator, wherein the critical point drying comprises submerging the resonator 12 in a solvent (e.g., isopropyl alcohol, ethanol, etc.), wherein the solvent is at its critical point, and drying the resonator.

The ground electrode 189 is disposed on a bottom major surface of the silicon carbide resonator plate 128 while electrodes 119 and/or 120 are disposed on the top major surface of the silicon carbide resonator plate 128, the top major surface of the silicon carbide resonator plate being parallel to the bottom major surface of the silicon carbide resonator plate 128. The silicon carbide resonator plate 128 preferably has its crystalline c-axis oriented perpendicular to said ground electrode 189.

What follows is a brief discussion of the embodiments and possible modifications thereof presented and contemplated herein.

The resonator plate 128 can be a plate made of or etched from 3C-, 4H-, or 6H-SiC.

The resonator plate 128 can be made of single crystalline 4H-SiC or single crystalline 6H-SiC.

The shape of resonator plate 128 can be rectangular, square, circular, oval, or elliptical. In a preferred embodiment, the resonator plate 128 is made of a single piezoelectric layer (e.g. of SiC), wherein the single layer is disposed between the bottom electrode 189 and the electrodes 119/120.

The two electrodes 119 and 120 preferably have a total of N electrode fingers F.

Generally, the electrodes 119 and 120 are designed to create an electric field within the resonator plate 128, wherein the electric field alternates in polarity along the length of resonator plate 128.

The electrodes 119 and 120 can cover a majority of the top surface of the resonator plate 128. The electrodes 119 and 120 are each preferably elongated along a major axis with a plurality (or an array) of protrusions or fingers F projecting therefrom, the protrusions or fingers F of one electrode being interdigitated with the protrusions or fingers F of the other electrode, thereby defining a narrow serpentine path or gap 121 between the electrodes 119 and 120. The narrow serpentine path or gap 121 exposes the resonator plate 128 below. The protrusions or fingers F preferably have uniform widths and thus also a uniform pitch (given that the width of the gap 121 also preferably remains uniform). During operation, a first RF signal (e.g. v(t), where v is voltage and t is time) is applied to the one of the electrodes and its array of fingers F and an optional second RF signal (e.g. −v(t)) is applied to the other of the electrodes and its array of fingers F.

In at least one embodiment (where the resonator 12 is utilized as a one port device), electrode 119 in use is a driving electrode (for example) and electrode 120 is a sensing electrode (for example) and wherein, for example, a RF signal is applied to the electrode 119 and a piezoelectric response is sensed by the electrode 120. In another embodiment (where the resonator 12 is utilized as a two port device), the electrodes 119 and 120 both function, in use, as driving electrodes, wherein a RF signal is applied to each of them and for example, a RF signal (e.g. +v(t), where v is voltage and t is time) is applied to the electrode 119, and a phase shifted signal (e.g. signal equivalent to −v(t)) of the RF signal is applied to the electrode 120.

In at least one embodiment, the bottom electrode 189 is preferably grounded and restricts the electric field formed by the electrodes 119 and 120 to being polarized in the thickness direction (e.g. z-direction) of the resonator plate 128. In a preferred embodiment, the bottom electrode 189 restricts a majority or all of the electric field within the resonator plate 128 to being polarized in generally the thickness direction of the resonator plate 128.

In a preferred embodiment, the bottom electrode 189 and the electrodes 119 & 120 occupy the same area, wherein the bottom electrode 189 covers a majority of the bottom surface of the resonator plate 128 and the two electrodes 119 & 120 cover a majority of the upper surface of the resonator plate 128. In other embodiments, the bottom electrode 189 has a larger area than that of the electrodes 119/120. In general, the bottom electrode 189 can be any shape that preferably constrains the electric field within the resonator plate 128 to being polarized in its thickness direction.

Generally, the Si handle layer 166 is configured to be a supporting substrate for the resonator plate 128 and SiC layer 170. The Si handle layer 166 can be replaced by a layer made of anything to which a layer of $SiO_2$ can be applied. In at least one embodiment, the Si handle layer 166 is replaced by a complementary metal-oxide semiconductor (CMOS) wafer.

The vias 113 can have a circular cross-section or a rectangular cross section or any other convenient shape. Preferably, the vias 113 are shaped so that the via metal 112 can coat (or fill) the sidewall(s) of the via 113.

The via metal is preferably Cr/Ni/Au, deposited in that order. The gold (Au) layer is used since gold is a good electrical conductor. The nickel (Ni) layer is used as a barrier layer to prevent the gold of the gold layer from reacting with the substrate at an elevated temperature during fabrication. The chromium (Cr) layer is used as an adhesion layer for the nickel and gold layers.

The SiC layer 170 surrounding (or at least partially surrounding) resonator plate or body 128 can function as a frame disposed around, but spaced from, the resonator 12.

The traces 117 and 123 and electrodes 119 and 120 are preferably metallic; they may be made of chromium/gold (Cr/Au), deposited in that order, wherein the Cr layer is an adhesion layer for the Au layer. The traces 117 and 123 and electrodes 119 and 120 may be made of electrically conductive metals such as gold (Au), copper (Cu), silver (Ag), aluminum (Al), chromium (Cr), titanium (Ti), Nickel (Ni), etc., or any alloys or combinations thereof.

The probe pad 114 is preferably metallic and may be made of chromium (Cr)/gold (Au), deposited in that order.

The resonator plate 128 may have a thickness in the range 2 to 4 and preferably has a thickness of 3.5 μm.

The tethers 118 comprise unetched regions of the thin SiC layer. Generally, the tethers 118 connect the resonator plate 128 to SiC layer 170 so that the tethers 118 support the resonator plate 128 from the surrounding frame. The tethers 118 are preferably designed to reduce or minimize the energy lost during each cycle of oscillation of the resonator, thereby increasing or maximizing the quality factor of the resonator. Increasing the quality factor of the resonator can comprise reducing a cross sectional area of tethers 118 (e.g. by additional etching).

Though only two tethers are shown in the resonator depicted in the various figures, the resonator can comprise more than two tethers or even a single tether to support the resonator plate 128.

The resonator can comprise one tether or two tethers, and in a preferred embodiment, the resonator comprises a multiple of two tethers to support the resonator body.

In an alternative embodiment, the electrodes 119/120 are formed on the bottom surface of the resonator body, and the ground electrode 189 is formed on the top surface of the resonator body; the biasing of the resonator is such that the signal pads 131 are electrically connected to the metallized vias 113 and the metallized vias 113 are electrically connected to the electrodes 119/120; the ground electrode is electrically connected to the ground pads 138.

6H-SiC is preferably used because its crystalline structure is compatible with many materials. For example, 6H-SiC is compatible with gallium nitride (GaN) since GaN can be grown on a SiC substrate, which is useful for RF applications. SiC is used in the resonator because SiC has great electrical, mechanical, and thermal properties. For example, 6H-SiC has a high Young's modulus of Ey 450 GPa, a high thermal conductivity of 490 W/(m·K), and a wide bandgap of 3.0 eV. Additionally, 6H-SiC is readily available in the form of high quality wafers.

4H SiC has a bandgap of 3.2 eV, which makes 4H-SiC useful for high-voltage operations.

The resonator plate 128, tethers 118, and layer 170 can be made of 4H-, 6H-, or 3C-SiC, but preferably, the resonator plate 128, tethers 118, and layer 170 are made of 6H-SiC for the reasons stated above.

The piezoelectric effect can refer to the property of a material to become electrically polarized when subjected to mechanical stress and conversely, to mechanically deform under an application of an electric field. Piezoelectricity can be used as a transduction technique for electrically inducing (actuating) or detecting (sensing) a mechanical deformation of a structure. Due to the reciprocity of the piezoelectric effect, a displacement of the resonator can be sensed by detecting the voltage difference as a result of the change in the electric field induced by a mechanical strain caused by the displacement. When the resonator is vibrating, an oscillating voltage with a frequency equal to the frequency of the mechanical oscillations of the resonator can be detected across the piezoelectric material by a sensing electrode.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this presentation with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this presentation is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A resonator comprising:
a resonator body and a frame at least partially surrounds the resonator body, the resonator body being coupled to the frame by at least one tether; the resonator body, frame and at least one tether comprising silicon carbide;
a plurality of interdigitated electrodes disposed on a first major surface the silicon carbide resonator body.

2. The resonator of claim 1, wherein the resonator body is made of 4H silicon carbide.

3. The resonator of claim 1, wherein the resonator body is made of 6H silicon carbide.

4. The resonator of claim 1, wherein the resonator body is made of 3C silicon carbide.

5. The resonator of claim 1, wherein the resonator body, frame and at least one tether are formed from a unitary body of a single polytype of silicon carbide.

6. The resonator of claim 5, wherein the resonator body has a thickness in the range 2.5 μm to 4.0 μm.

7. The resonator of claim 1, wherein further including a planar ground electrode disposed on a second major surface of the silicon carbide resonator body, the second major surface of the silicon carbide resonator being parallel to the first major surface of the silicon carbide resonator body and wherein the silicon carbide resonator body is crystalline and has its crystalline c-axis oriented perpendicular to said planar ground electrode.

8. The resonator of claim 1, wherein the interdigitated electrodes each comprise first and second arrays of electrically conductive protrusions or fingers.

9. The resonator of claim 8, wherein the first and second arrays of the electrically conductive protrusions or fingers have a pitch in a range of 10 to 13 μm.

10. The resonator of claim 3, wherein the 6H silicon carbide of the resonator body has a crystalline c-axis oriented generally parallel to a thickness direction of the resonator body.

11. The resonator of claim 5, wherein each interdigitated electrode comprises interleaved protrusions or fingers disposed along a length of the resonator body, and wherein the resonator has a resonant frequency $f=Nv_{acoustic}/(2L)$, where N is the total number of interleaved protrusions or fingers, L is the length of the resonator body, and $V_{acoustic}$ is a speed of sound in the resonator body.

12. The resonator of claim 1, wherein the interleaved electrodes are configured to form an electric field that alternates in polarity along a length of the resonator body, thereby forming strain regions that alternate in polarity along the length of the resonator body.

13. The resonator of claim 1, wherein the resonator has a frequency-quality factor product in the range $3 \times 10^{12}$ to $6 \times 10^{14}$.

14. The resonator of claim 1, wherein the resonator has a quality factor of at least 7400.

15. The resonator of claim 1, wherein the resonator has a resonant frequency in the range 300 MHz to 3 GHz.

16. A resonator, comprising:
a first silicon carbide layer;
a first electrode disposed on a first surface of the first silicon carbide layer;
a second electrode disposed on a second surface of the first silicon carbide layer;
a tether attached to the first silicon carbide layer; and
a second silicon carbide layer attached to the tether,
wherein the first and second electrodes are configured to form an electric field in the first silicon carbide layer.

17. The resonator of claim 16, wherein, during operation, the electric field is polarized along a thickness direction of the first silicon carbide layer.

18. The resonator of claim 17, wherein, during operation, the electric field alternates in polarity along a length of the first silicon carbide layer.

19. The resonator of claim 16, wherein the first and second silicon carbide layers are made of 4H silicon carbide.

20. The resonator of claim 16, wherein the first and second silicon carbide layers form a unitary layer of 6H silicon carbide.

21. The resonator of claim 17, wherein, the first silicon carbide layer has a crystalline c-axis that is generally parallel to a thickness direction of the first silicon carbide layer.

22. The resonator of claim 16, wherein the first and second silicon carbide layers form a unitary layer of 3C silicon carbide.

23. A resonator, comprising:
a frame;
a silicon carbide resonator plate attached to the frame by tethers;
a first electrode disposed on a first surface of the silicon carbide resonator plate;
a second electrode disposed on a second surface of the silicon carbide resonator plate,
wherein the first and second electrodes are configured to form an electric field in the silicon carbide resonator plate.

24. The resonator of claim 23, wherein the frame includes a substrate and wherein a silicon carbide layer (i) forms the silicon carbide resonator plate and the tethers and (ii) is also attached to the substrate of the frame.

\* \* \* \* \*